US008963649B2

United States Patent
Li et al.

(10) Patent No.: US 8,963,649 B2
(45) Date of Patent: Feb. 24, 2015

(54) PLL WITH OSCILLATOR PVT COMPENSATION

(71) Applicants: Matt Li, Hsinchu (TW); Min-Shueh Yuan, Taipei (TW); Chih-Hsien Chang, New Taipei (TW)

(72) Inventors: Matt Li, Hsinchu (TW); Min-Shueh Yuan, Taipei (TW); Chih-Hsien Chang, New Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 70 days.

(21) Appl. No.: 13/731,687

(22) Filed: Dec. 31, 2012

(65) Prior Publication Data
US 2014/0184343 A1 Jul. 3, 2014

(51) Int. Cl.
*H03L 1/00* (2006.01)
*H03L 7/06* (2006.01)
*H03B 5/10* (2006.01)

(52) U.S. Cl.
CPC ... *H03L 7/06* (2013.01); *H03L 1/00* (2013.01); *H03B 5/10* (2013.01)
USPC ............. 331/175; 331/34; 331/176; 327/261; 327/262; 327/270; 327/156

(58) Field of Classification Search
CPC ... H03L 7/0805; H03L 7/0812; H03L 7/0995; H03L 7/08; H03L 7/18; H03L 7/102
USPC ........ 331/16, 17, 34, 175, 176, 183; 327/141, 327/156, 158, 261, 262, 263, 270
See application file for complete search history.

(56) References Cited

U.S. PATENT DOCUMENTS

| | | | |
|---|---|---|---|
| 6,864,756 B2 | 3/2005 | Peng | |
| 7,786,771 B2 | 8/2010 | Tsai et al. | |
| 8,362,848 B2 * | 1/2013 | Raghunathan et al. | ....... 331/186 |
| 2002/0075080 A1 | 6/2002 | Nelson et al. | |

* cited by examiner

*Primary Examiner* — Arnold Kinkead
(74) *Attorney, Agent, or Firm* — Lowe Hauptman & Ham, LLP

(57) ABSTRACT

A voltage controlled oscillator (VCO) includes a current controlled oscillator, a voltage-to-current converter, and a sensing circuit. The sensing circuit includes a delay unit, and the sensing circuit is configured to generate a plurality of compensation control signals in response to a time delay of the delay unit. The voltage-to-current converter is configured to generate a current signal in response to a VCO control signal and the plurality of compensation control signals. The current controlled oscillator is configured to generate an oscillating signal in response to the current signal.

20 Claims, 5 Drawing Sheets

PLL WITH OSCILLATOR PVT COMPENSATION

BACKGROUND

A Phase Lock Loop (PLL) is an electrical circuit usable to generate an oscillating signal by comparing a reference signal and a feedback signal obtained by frequency-dividing the generated oscillating signal. As such, electrical signals in a PLL form an electrical feedback loop, and the PLL is considered functional if, among other factors, the electrical feedback loop is stable. The electrical feedback loop is stable when a signal fluctuation in the PLL at a particular node along the electrical feedback loop is attenuated rather than amplified over time. Although a PLL design may be meant to be stable on the circuit diagram, in the context of mass production of PLLs based on the PLL design using semiconductor manufacturing processes, some of the manufactured PLLs become unstable due to process, voltage, and temperature (PVT) variations.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
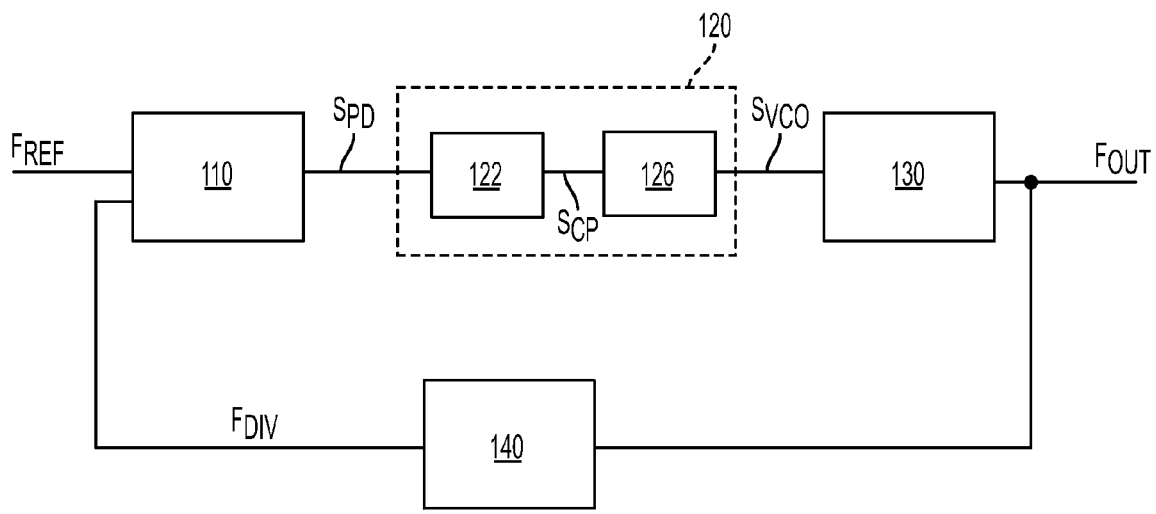
FIG. 1 is a functional block diagram of a PLL in accordance with some embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

FIG. 1 is a functional block diagram of a Phase Lock Loop (PLL) 100 in accordance with some embodiments. The PLL 100 includes a phase detector 110, a control signal generator 120, a voltage controlled oscillator (VCO) 130, and a divider 140. The phrase detector 110 receives a reference signal $F_{REF}$ and a feedback signal $F_{DIV}$ from the divider 140, and generates a phase detection signal $S_{PD}$ based on the reference signal $F_{REF}$ and the feedback signal $F_{DIV}$. The control signal generator 120 receives the phase detection signal $S_{PD}$ and generates a voltage control signal $S_{VCO}$ in response to the phase detection signal $S_{PD}$. The VCO 130 generates an output oscillating signal $F_{OUT}$ in response to the voltage control signal $S_{VCO}$. The divider 140 generates the feedback signal $F_{DIV}$ by frequency-dividing the output oscillating signal $F_{OUT}$ by a predetermined factor N. In some embodiments, N is an integer or a fractional number. Also, the control signal generator 120 includes a charge pump 122 and a loop filter 126. The charge pump 122 generates a charge pump output signal $S_{CP}$ in response to the phase detection signal $S_{PD}$. The loop filter 126 outputs the voltage control signal $S_{VCO}$ by smoothening the waveform of the charge pump output signal $S_{CP}$.

Figure 2:
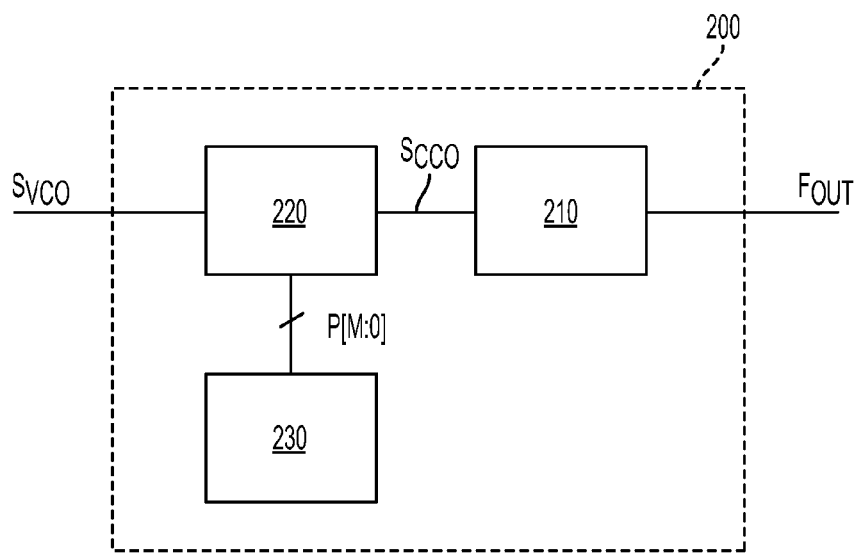
FIG. 2 is a functional block diagram of a voltage controlled oscillator (VCO) usable in a PLL as depicted in FIG. 1 in accordance with one or more embodiments.

FIG. 2 is a functional block diagram of a VCO 200 usable as the VCO 130 in the PLL 100 depicted in FIG. 1 in accordance with some embodiments. The VCO 200 includes a current controlled oscillator 210, a voltage-to-current converter 220, and a sensing circuit 230. The sensing circuit 230 generates a plurality of compensation control signals P[M:0] that reflects the amount of compensation under the process, voltage, and temperature (PVT) conditions of the PLL 100. The current controlled oscillator 210 generates the output oscillating signal $F_{OUT}$ in response to a current signal $S_{CCO}$. The voltage-to-current converter 220 generates the current signal $S_{CCO}$ in response to the voltage control signal $S_{VCO}$ and the plurality of compensation control signals P[M:0]. In some embodiments, M is a positive integer. In some embodiments, M is 0, and thus there is only one compensation control signal P[0] implemented in the VCO 200.

The sensing circuit 230 and the current controlled oscillator 210 inherently form a closed control loop through (1) the alteration of the PVT conditions as a result of operating the PLL 100 and (2) the observation of the PVT conditions by the sensing circuit 230. However, as depicted in FIGS. 1 and 2, the sensing circuit 230 and the current controlled oscillator 210 are arranged in a manner without electrically forming a feedback loop. Accordingly, compared with a PLL without the sensing circuit 200, the introduction of the sensing circuit 230 does not further complicate the stability analysis of the electrical signals in the PLL 100.

Figure 3:
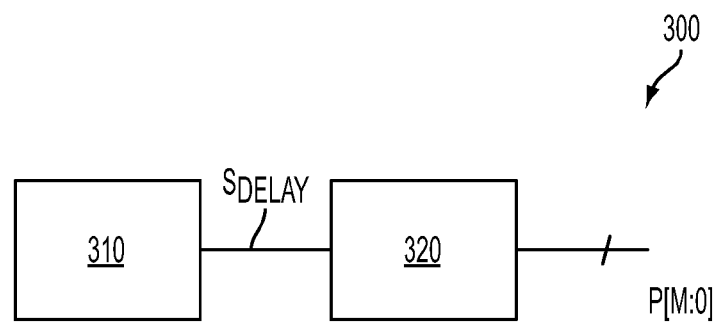
FIG. 3 is a block diagram of a sensing circuit usable in a VCO as depicted in FIG. 2 in accordance with one or more embodiments.

FIG. 3 is a block diagram of a sensing circuit 300 usable as the sensing circuit 230 in the VCO 200 depicted in FIG. 2 in accordance with one or more embodiments. The sensing circuit 300 includes a delay unit 310 and a signal converter 320. The delay unit 310 generates a pulse signal $S_{DELAY}$ having a pulse width representing a time delay of the delay unit 310. The signal converter 320 generates the plurality of compensation control signals P[M:0] in response to the pulse width of the pulse signal $S_{DELAY}$.

Figure 4A:
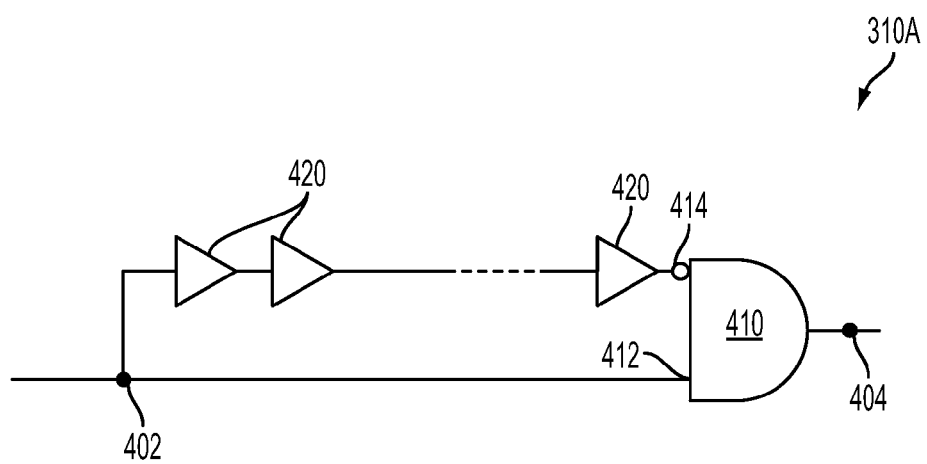
FIG. 4A and FIG. 4B are block diagrams of example delay units usable in a sensing circuit as depicted in FIG. 3 in accordance with one or more embodiments.

FIG. 4A is a block diagram of an example delay unit 310A usable in a sensing circuit 300 as depicted in FIG. 3 in accordance with one or more embodiments. The delay unit 310A includes an input node 402 and an output node 404. The input node 402 receives a reference signal, such as a reference clock or a reference step signal, when the delay unit 310A is activated to generate the pulse signal $S_{DELAY}$ at the output node 404. The delay unit 310A further includes an AND gate 410 and a plurality of buffers 420. The AND gate 410 has a first input terminal 412 and a second input terminal 414. In some embodiments, one of the first input terminal 412 and the second input terminal 414 is an inverted input terminal. For example, the second input terminal 414 depicted in FIG. 4A is an inverted input terminal. The input node 402 is electrically connected to the first input terminal 412 of the AND gate 410. The plurality of buffers 420 are connected in series between the input node 402 and the second input terminal 414 of the AND gate 410.

Figure 4B:
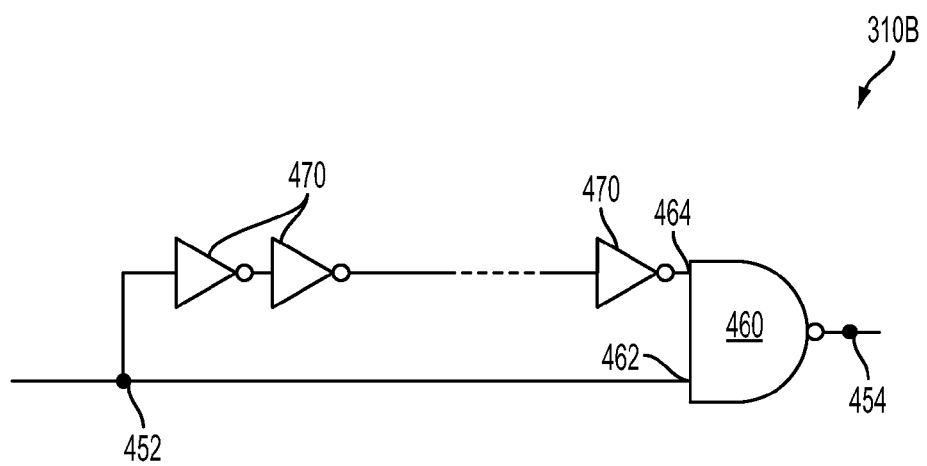

FIG. 4B is a block diagram of another example delay unit 310B usable in a sensing circuit 300 as depicted in FIG. 3 in accordance with one or more embodiments. The delay unit 310B includes an input node 452 and an output node 454. The input node 452 receives a reference signal, such as a reference clock or a reference step signal, when the delay unit 310B is activated to generate the pulse signal $S_{DELAY}$ at the output node 454. The delay unit 310B further includes a NAND gate 460 and a plurality of inverters 470. The NAND gate 460 has a first input terminal 462 and a second input terminal 464. The input node 452 is electrically connected to the first input terminal 462 of the NAND gate 460. The plurality of inverters 470 are connected in series between the input node 452 and the second input terminal 464 of the NAND gate 460. In some embodiments, instead of having a plurality of inverters 470, there is only one inverter 470 between the input node 452 and the second input terminal 464. In some embodiments, one or more buffers and the one or more inverters 470 are connected in series between the input node 452 and the second input terminal 464.

Figure 4C:
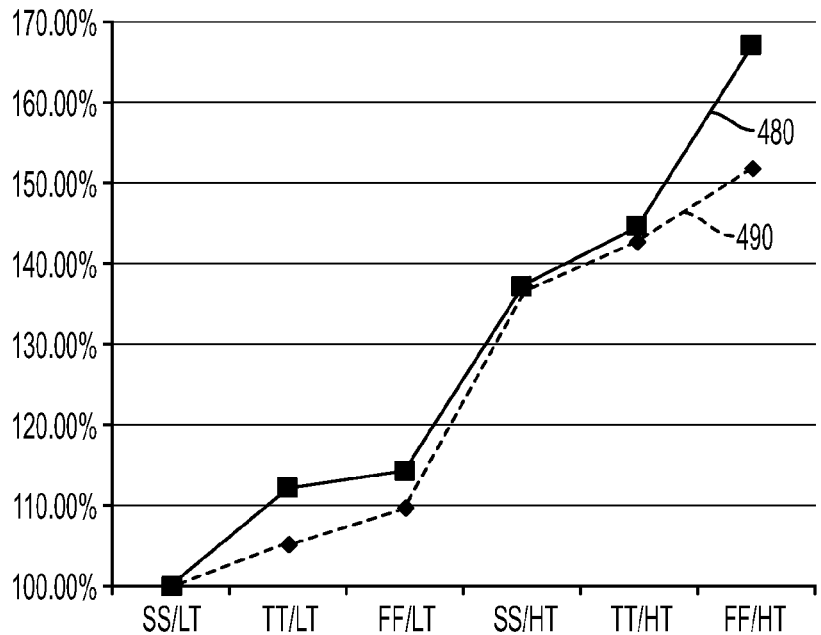
FIG. 4C is a chart of a delay (as a period of time) of the delay unit depicted in FIG. 4A or FIG. 4B and a VCO gain of the VCO depicted in FIG. 2 in accordance with one or more embodiments.

FIG. 4C is a chart of a delay of the delay unit 310A or the delay unit 310B and a VCO gain of the VCO 200 depicted in FIG. 2 in accordance with one or more embodiments. In FIG. 4C, "SS" denotes the P-type devices in the VCO 200 having the slowest speed according to a predetermined process variation range (i.e., slow corner), and the N-type device in the VCO 200 being at the slow corner as well. "TT" denotes the P-type devices having the nominal speed within the predetermined process variation range (i.e., typical corner), and the N-type device being at the typical corner as well. "FF" denotes the P-type devices having the highest speed according to the predetermined process variation range (i.e., fast corner), and the N-type device being at the fast corner as well. "LT" denotes the lowest operation temperature according to a predetermined set of operation conditions, and "HT" denotes the highest operation temperature according to the predetermined set of operation conditions.

As depicted in FIG. 4C, using the delay and the VCO gain at the SS/LT corner as the basis for comparison, the VCO gain (curve 480) and the inverse of the delay (curve 490) have basically the same trend of variation. Therefore, by increasing the VCO gain in conjunction with a longer delay and decreasing the VCO gain in conjunction with a shorter delay, the variation of the VCO gain across various process/operation corners is reduced. In at least one embodiment, the variation of the VCO gain is reduced from about more than 50% to less than 15%. In some embodiments, as a result of the reduced range of variation, a circuit designer of a PLL only need to perform the stability analysis of the PLL within the reduced range of variation. In some embodiments of designing PLLs, compared with a wider range of PVT variation, advantages of focusing stability analysis within a reduced range of PVT variation include smaller circuit size, wider band width, and improved PLL performance.

As depicted in FIG. 4C and FIG. 2, in some embodiments, each of the plurality of compensation control signals P[M:0] is either at a logic high level or a logic low level. The greater the delay, the more of the plurality of compensation control signals P[M:0] are at the logic high level. Thus, the plurality of compensation control signals P[M:0] is usable to adjust the VCO gain of the VCO 200.

Figure 5A:
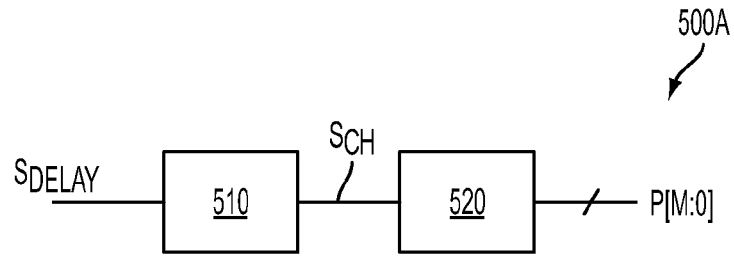
FIG. 5A and FIG. 5B are block diagrams of example signal converters usable in a sensing circuit as depicted in FIG. 3 in accordance with one or more embodiments.

FIG. 5A is a block diagram of an example signal converter 500A usable as the signal converter 320 in the sensing circuit 300 depicted in FIG. 3 in accordance with one or more embodiments. The signal converter 500A includes a charging circuit 510 and an analog-to-digital converter (ADC) 520. The charging circuit generates a charged signal $S_{CH}$ based upon the pulse width of the pulse signal $S_{DELAY}$. Therefore, the time-domain information regarding the pulse width of the pulse signal $S_{DELAY}$, i.e., the delay of the delay unit 310, is translated into a voltage level of the charged signal $S_{CH}$. Then, the ADC 520 generates a digitized value of the charged signal $S_{CH}$ and outputs the digitized value, in a form of a binary code or a thermometer code, as the plurality of compensation control signals P[M:0]. For example, in at least one embodiment, the "binary code" for decimal number 4 is "100," and the "thermometer code" for decimal number 4 is "1111." In some embodiments, the ADC 520 includes a set of registers that keeps the values of the plurality of compensation control signals P[M:0] until next time the sensing circuit is activated again.

Figure 5B:
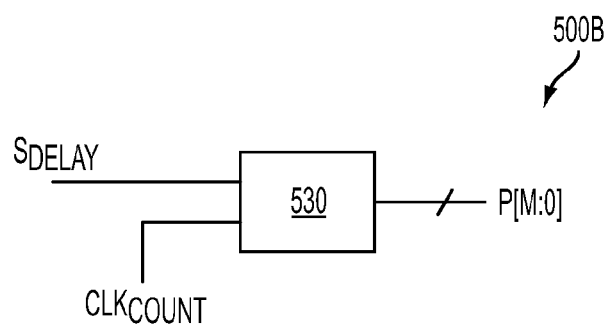

FIG. 5B is a block diagram of another example signal converter 500B usable as the signal converter 320 in the sensing circuit 300 depicted in FIG. 3 in accordance with one or more embodiments. The signal converter 500B includes a counter 530 that receives the pulse signal $S_{DELAY}$ and a counter clock signal $CLK_{COUNT}$ and generates a count value based upon the pulse width of the pulse signal $S_{DELAY}$. Therefore, the time-domain information regarding the pulse width of the pulse signal $S_{DELAY}$, i.e., the delay of the delay unit 310, is translated into the count value. Then, the signal converter 500B outputs the count value, in a form of a binary code or a thermometer code, as the plurality of compensation control signals P[M:0]. In some embodiments, the counter 530 includes a set of registers that keeps the values of the plurality of compensation control signals P[M:0] until next time the sensing circuit is activated again. In some embodiments, the counter 530 is not reset until next time the sensing circuit is activated again in order to keep the values of the plurality of compensation control signals P[M:0].

Figure 5C:
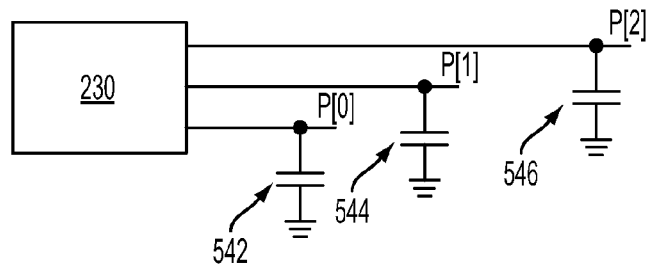
FIG. 5C is a block diagram of a sensing circuit as depicted in FIG. 3 with a plurality of low pass filters in accordance with one or more embodiments.

FIG. 5C is a block diagram of a sensing circuit 230 as depicted in FIG. 3 with a plurality of low pass filters in accordance with one or more embodiments. In the example depicted in FIG. 5C, the sensing circuit 230 is connected with three signal lines for outputting three corresponding compensation control signals P[0], P[1], and P[2]. Each of the signal lines is coupled with a low pass filter (e.g., a capacitor) 542, 544, and 546. The low pass filters 542, 544, and 546 smoothen the waveforms of the corresponding compensation control signals P[0], P[1], and P[2]. As a result, a sudden change of the VCO gain of the VCO 200 is avoided, and the glitch and jitter at the output oscillating signal $F_{OUT}$ as a result of the VCO gain compensation are reduced.

In some embodiments, not all the compensation control signals P[M:0] are coupled with corresponding low pass filters 542, 544, and 546. In some embodiments, all the compensation control signals P[M:0] are coupled with the voltage-to-current converter 220 without coupling to any low pass filters 542, 544, and 546.

Figure 6A:
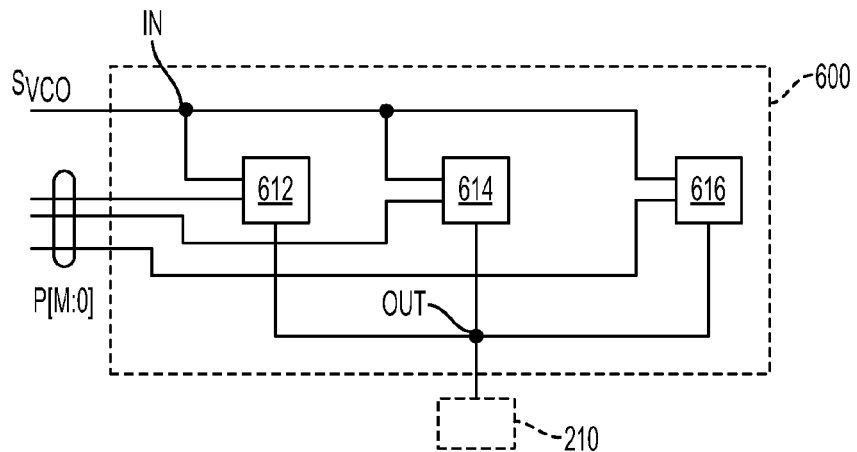
FIG. 6A is a functional block diagram of an example voltage-to-current converter in accordance with one or more embodiments.

FIG. 6A is a functional block diagram of an example voltage-to-current converter 600, which is usable as the voltageto-current converter 220 depicted n FIG. 2, in accordance with one or more embodiments. The voltage-to-current converter 600 has an input node IN configured to receive the VCO control signal $S_{VCO}$, an output node OUT configured to output a current signal $S_{CCO}$ to the current controlled oscillator 210, and a plurality of current generation units 612, 614, and 616. Each of the current generation units 612, 614, and 616 is coupled to a corresponding one of the plurality of compensation control signals P[M:0] and is selectively enabled or disabled in response to the corresponding compensation control signal. Each of the current generation units 612, 614, and 616 is also coupled to the VCO control signal $S_{VCO}$ and configured to generate, when being enabled, a current signal in response to the VCO control signal $S_{VCO}$. The current generation units 612, 614, and 616 are coupled to the output node OUT. The current generation units 612, 614, and 616 collectively generate the current signal $S_{CCO}$.

The voltage-to-current converter 600 depicted in FIG. 6A has three current generation units 612, 614, and 616. However, in some embodiments, the voltage-to-current converter 600 has more or less than three current generation units. In some embodiments, there are one or more additional current generation units that are always enabled to generate a current signal in response to the VCO control signal $S_{VCO}$.

Figure 6B:
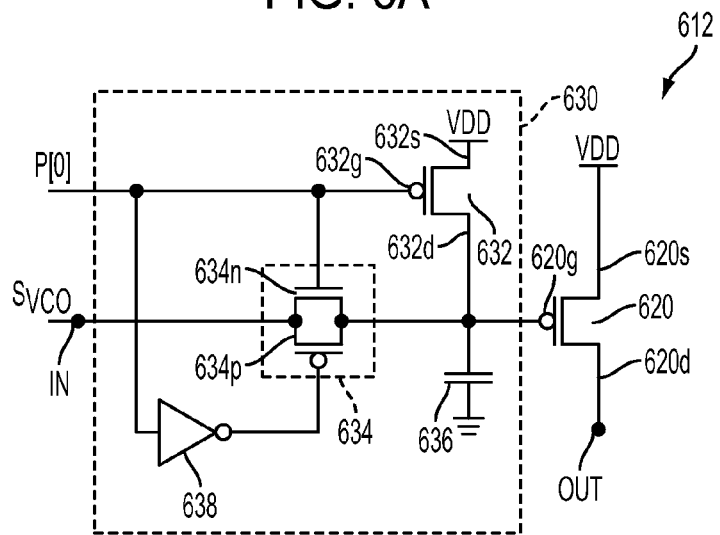
FIG. 6B is a circuit diagram of a current source and a corresponding switching circuit usable in a voltage-to-current converter as depicted in FIG. 6A in accordance with one or more embodiments.

FIG. 6B is a circuit diagram of a current generation unit 612 usable in the voltage-to-current converter 600 depicted in FIG. 6A in accordance with one or more embodiments. In some embodiments, current generation unit 614 and current generation unit 616 have the same configuration as the current generation unit 612.

The current generation unit 612 includes a transistor 620 functioning as a current source, and a switching circuit 630 for selectively enabling or disabling the transistor 620 in response to a corresponding one of the plurality of compensation control signals P[0]. The transistor 620 includes a drain terminal 620d coupled to the output node OUT, a source terminal 620s coupled to a power supply node VDD, and a gate terminal 620g. The switching circuit 630 includes another transistor 632, a pass gate 634, and a low pass filter 636. The transistor 632 includes a drain terminal 632d coupled to the gate terminal 620g of the transistor 620, a source terminal 632s coupled to the power supply node VDD, and a gate terminal 632g. The pass gate 634 is coupled between the gate terminal 620g of the transistor 620 and the input node IN. The low pass filter 636 is a capacitor arranged to smoothen the waveform of the signal at the gate terminal 620g of the transistor 620, and in turn avoid a sudden change in the amount of current output by the transistor 620.

In the embodiment depicted in FIG. 6B, the transistors 620 and 632 are P-type Metal-Oxide Semiconductor Field Effect Transistors ("PMOS Transistors"). The gate terminal 632g of the transistor 632 and the pass gate 634 are controlled by the compensation control signal P[0]. When the compensation control signal P[0] is at a logic low level, the transistor 632 is turned on and the pass gate 634 is turned off. Therefore, the voltage level at the gate terminal 620g of the transistor 620 is pulled to the voltage level of the power supply node VDD. As such, the transistor 620 is turned off, and the current generation circuit 612 is disabled. When the compensation control signal P[0] is at a logic high level, the transistor 632 is turned off and the pass gate 634 is turned on. Therefore, the gate terminal 620g of the transistor 620 is coupled to the input node IN to receive the VCO control signal $S_{VCO}$. As such, the transistor 620 is biased to generate a current according to the VCO control signal $S_{VCO}$, and the current generation circuit 612 is deemed enabled.

In the embodiment depicted in FIG. 6B, the pass gate 634 has a PMOS transistor 634p and an N-type Metal-Oxide Semiconductor Field Effect Transistor ("NMOS Transistor") 634n connected as a transmission gate. The NMOS transistor 634n is controlled by the compensation control signal P[0], and the PMOS transistor 634p is controlled by an inversed version of the compensation control signal P[0] (through an inverter 638). In some embodiments, the pass gate 634 has only the PMOS transistor 634p. In some embodiments, the pass gate 634 has only the NMOS transistor 634n.

A person having ordinary skill in the art would appreciate that the delay of the delay unit 310, the resolution of the signal converter 320, the number of the compensation control signals (M+1), and the current capacity of the current generation units 616 are set to minimize the PVT variation of a PLL design throughout a predetermined range of variation based on a predetermined semiconductor manufacturing process. In some embodiments, the optimization of the components is conducted by executing a circuit simulation software program that is capable of simulate the characteristics of the circuit at various variation corners.

Figure 7:
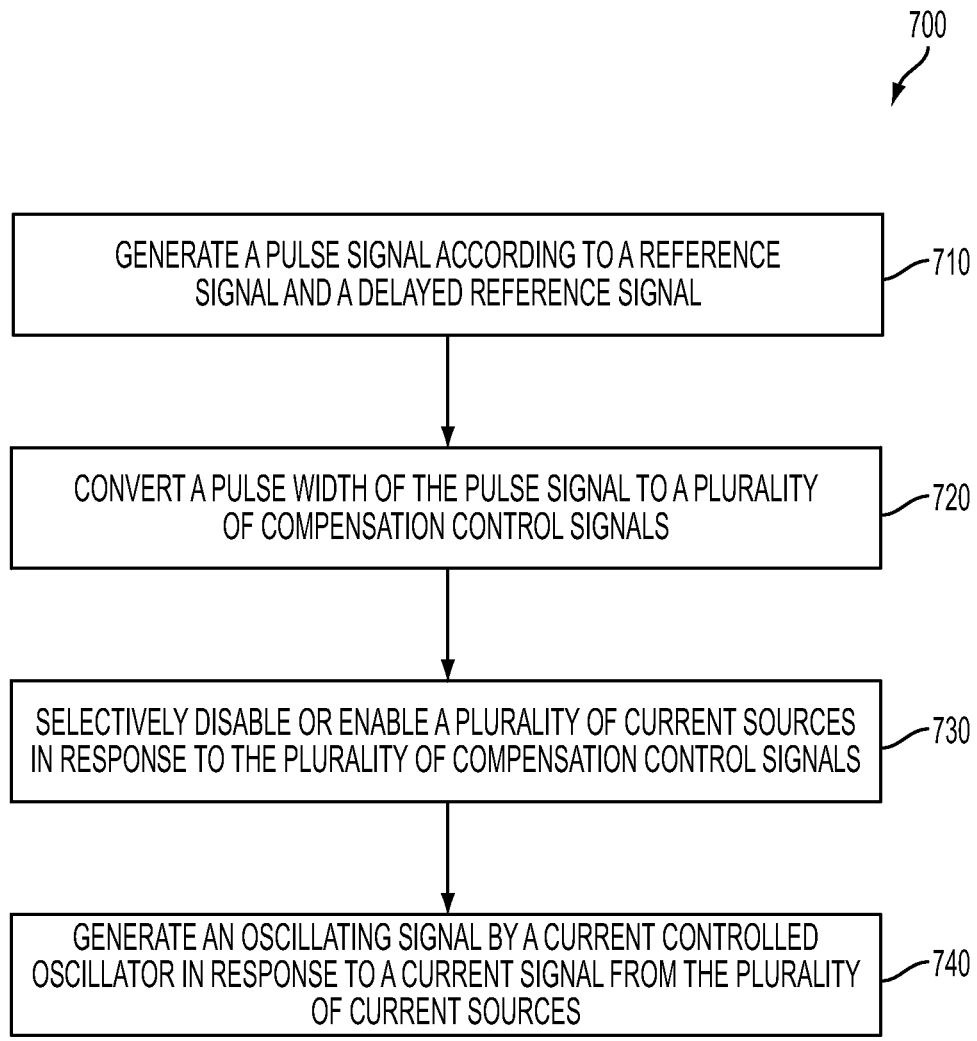
FIG. 7 is a flow chart of a method of operating a VCO as depicted in FIG. 2 in accordance with one or more embodiments.

FIG. 7 is a flow chart of a method 700 of operating a VCO 200 as depicted in FIG. 2 in accordance with one or more embodiments. It is understood that additional operations may be performed before, during, and/or after the method 700 depicted in FIG. 7, and that some other processes may only be briefly described herein.

As depicted in FIG. 7 and FIGS. 2 and 3, in operation 710, a pulse signal $S_{DELAY}$ is generated according to a reference signal and a delayed reference signal. In some embodiments, the reference signal is a reference clock or a reference step signal when the delay unit 310 is activated to generate the pulse signal $S_{DELAY}$.

The process then moves on to operation 720, where a pulse width of the pulse signal $S_{DELAY}$ is converted to a plurality of compensation control signals P[M:0]. The plurality of compensation control signals P[M:0] corresponds to a value of the pulse width in a form of a binary code or a thermometer code.

As depicted in FIG. 7 and FIGS. 6A and 6B, the process then moves on to operation 730, where a plurality of current sources of the current generating units 612, 614, and 616 are selectively enabled or disabled in response to the plurality of compensation control signals P[M:0]. The plurality of current sources of the current generating units 612, 614, and 616 collectively generates a current signal $S_{CCO}$ at the output node O of the voltage-to-current converter 220.

As depicted in FIG. 7 and FIGS. 2 and 3, the process then moves on to operation 740, where an oscillating signal $F_{OUT}$ is generated by a current controlled oscillator 210 in response to the current signal $S_{CCO}$.

As depicted in FIG. 7 and FIGS. 4A and 4B, in some embodiments, the generating the pulse signal (operation 710) includes generating the delayed reference signal by delaying, using the plurality of serially-connected buffers 420 and/or inverters 470, the reference signal for a predetermined time delay. The delayed reference signal is inverted, and the pulse signal $S_{DELAY}$ is generated by performing an AND operation of the reference signal and the inverted, delayed reference signal.

As depicted in FIG. 7 and FIG. 6B, in some embodiments, the selectively disabling or enabling the plurality of current sources of the current generating units 612, 614, and 616 (operation 730) includes coupling a gate 620g of a transistor 620 to a VCO control signal $S_{VCO}$ after a corresponding one of the plurality of compensation control signals P[0] transitioning from a logic low level to a logic high level.

In accordance with one embodiment, a voltage controlled oscillator (VCO) includes a current controlled oscillator, a voltage-to-current converter, and a sensing circuit. The sensing circuit includes a delay unit, and the sensing circuit is configured to generate a plurality of compensation control signals in response to a time delay of the delay unit. The voltage-to-current converter is configured to generate a current signal in response to a VCO control signal and the plurality of compensation control signals. The current controlled oscillator is configured to generate an oscillating signal in response to the current signal.

In accordance with another embodiment, a Phase Lock Loop (PLL) includes a phrase detector, a control signal generator, a voltage controlled oscillator (VCO), and a divider. The phrase detector is configured to generate a phase detection signal based on a reference signal and a feedback signal. The control signal generator is configured to generate a voltage control signal in response to the phase detection signal. The VCO is configured to generate an output oscillating signal in response to the voltage control signal. The divider is configured to generate the feedback signal by frequency-dividing the output oscillating signal. The VCO includes a current controlled oscillator, a voltage-to-current converter, and a sensing circuit. The sensing circuit is configured to generate a plurality of compensation control signals. The voltage-to-current converter is configured to generate a current signal in response to the voltage control signal and the plurality of compensation control signals. The current controlled oscillator is configured to generate the output oscillating signal in response to the current signal. The sensing circuit and the current controlled oscillator are arranged without electrically forming a feedback loop.

In accordance with another embodiment, a method of operating a voltage controlled oscillator (VCO) includes generating a pulse signal according to a reference signal and a delayed reference signal. A pulse width of the pulse signal is converted to a plurality of compensation control signals, and the plurality of compensation control signals corresponds to a value of the pulse width in a form of a binary code or a thermometer code. One or more of a plurality of current sources are selectively disabled or enabled in response to corresponding one or more of the plurality of compensation control signals, where the plurality of current sources collectively generate a current signal. An oscillating signal is generated by a current controlled oscillator in response to the current signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A voltage controlled oscillator (VCO), comprising:
    a sensing circuit comprising a delay unit, the sensing circuit being configured to generate a plurality of compensation control signals in response to a time delay of the delay unit;
    a voltage-to-current converter configured to generate a current signal in response to a VCO control signal and the plurality of compensation control signals; and
    a current controlled oscillator configured to generate an oscillating signal in response to the current signal.

2. The VCO of claim 1, wherein the sensing circuit comprises:
    the delay unit configured to generate a pulse signal, the pulse signal having a pulse width representing the time delay of the delay unit; and
    a signal converter configured to generate the plurality of compensation control signals in response to the pulse width of the pulse signal.

3. The VCO of claim 2, wherein the delay unit comprises:
    an AND gate having a first input terminal and a second input terminal, one of the first input terminal and the second input terminal being an inverted input terminal;
    an input node electrically connected to the first input terminal of the AND gate; and
    a plurality of buffers connected in series between the input node and the second input terminal of the AND gate.

4. The VCO of claim 2, wherein the delay unit comprises:
    a NAND gate having a first input terminal and a second input terminal;
    an input node electrically connected to the first input terminal of the NAND gate; and
    one or more inverters connected in series between the input node and the second input terminal of the NAND gate.

5. The VCO of claim 2, wherein the signal converter comprises a counter configured to generate a count value based upon the pulse width of the pulse signal and output the count value, in a form of a binary code or a thermometer code, as the plurality of compensation control signals.

6. The VCO of claim 2, wherein the signal converter comprises:
    a charging circuit configured to generate a charged signal based upon the pulse width of the pulse signal; and
    an analog-to-digital converter (ADC) configured to generate a digitized value of the charged signal and output the digitized value, in a form of a binary code or a thermometer code, as the plurality of compensation control signals.

7. The VCO of claim 2, wherein the signal converter comprises:
    a signal line configured to carry one of the plurality of compensation control signals; and
    a low pass filter coupled to the signal line.

8. The VCO of claim 1, wherein the voltage-to-current converter comprises:
    an input node configured to receive the VCO control signal;
    an output node configured to output the current signal;
    a plurality of current sources configured to collectively generate the current signal at the output node; and
    a plurality of switching circuits, each of the plurality of switching circuits being configured to selectively enable or disable a corresponding one of the plurality of current sources in response to a corresponding one of the plurality of compensation control signals.

9. The VCO of claim 8, wherein
    one of the plurality of current sources comprises a first transistor having a drain terminal coupled to the output node, a source terminal coupled to a power supply node, and a gate terminal; and
    one of the plurality of switching circuits corresponding to the one of the plurality of current sources comprises:
        a second transistor having a drain terminal coupled to the gate terminal of the first transistor and a source terminal coupled to the power supply node; and
        a pass gate coupled between the gate terminal of the first transistor and the input node.

10. The VCO of claim 9, wherein the one of the plurality of switching circuits corresponding to the one of the plurality of current sources comprises a low pass filter coupled to the gate terminal of the first transistor.

11. The VCO of claim 9, wherein the pass gate comprises only a PMOS transistor, only an NMOS transistor, or both the PMOS transistor and the NMOS transistor connected as a transmission gate.

12. A Phase Lock Loop (PLL), comprising:
a phase detector configured to generate a phase detection signal based on a reference signal and a feedback signal;
a control signal generator configured to generate a voltage control signal in response to the phase detection signal;
a voltage controlled oscillator (VCO) configured to generate an output oscillating signal in response to the voltage control signal, the VCO comprising:
a sensing circuit comprising a delay unit, the sensing circuit configured to generate a plurality of compensation control signals in response to a time delay of the delay unit;
a voltage-to-current converter configured to generate a current signal in response to the voltage control signal and the plurality of compensation control signals; and
a current controlled oscillator configured to generate the output oscillating signal in response to the current signal; and
a divider configured to generate the feedback signal by frequency-dividing the output oscillating signal,
the sensing circuit and the current controlled oscillator being arranged without electrically forming a feedback loop.

13. The PLL of claim 12, wherein the VCO has a VCO gain, the VCO gain has a VCO gain variation within a predetermined range of process or temperature variation of the VCO, and the delay unit, the voltage-to-current converter, and the sensing circuit are set to keep the VCO gain variation no greater than 15%.

14. The PLL of claim 12, wherein
the sensing circuit comprises:
the delay unit configured to generate a pulse signal; and
a signal converter configured to generate the plurality of compensation control signals in response to the pulse width of the pulse signal; and
the voltage-to-current converter comprises:
a plurality of current sources configured to collectively generate the current signal; and
a plurality of switching circuits, each of the plurality of switching circuits being configured to enable and disable a corresponding one of the plurality of current sources in response to a corresponding one of the plurality of compensation control signals.

15. The PLL of claim 14, wherein the delay unit comprises:
an AND gate having a first input terminal and a second input terminal, one of the first input terminal and the second input terminal being an inverted input terminal;
an input node electrically connected to the first input terminal of the AND gate; and
a plurality of buffers connected in series between the input node and the second input terminal of the AND gate.

16. The PLL of claim 14, wherein the signal converter comprises a counter configured to generate a count value based upon the pulse width of the pulse signal and output the count value, in a form of a binary code or a thermometer code, as the plurality of compensation control signals.

17. The PLL of claim 14, wherein the signal converter comprises:
a signal line configured to carry one of the plurality of compensation control signals; and
a capacitor coupled to the signal line.

18. A method of operating a voltage controlled oscillator (VCO), comprising:
generating a pulse signal according to a reference signal and a delayed reference signal;
converting a pulse width of the pulse signal to a plurality of compensation control signals, the plurality of compensation control signals corresponding to a value of the pulse width in a form of a binary code or a thermometer code;
selectively disabling or enabling one or more of a plurality of current sources in response to corresponding one or more of the plurality of compensation control signals, the plurality of current sources collectively generating a current signal; and
generating an oscillating signal by a current controlled oscillator in response to the current signal.

19. The method of claim 18, wherein the generating the pulse signal comprises:
generating the delayed reference signal by delaying the reference signal for a predetermined time delay;
inverting the delayed reference signal; and
generating the pulse signal by performing an AND operation of the reference signal and the inverted, delayed reference signal.

20. The method of claim 18, wherein the selectively disabling or enabling the plurality of current sources comprises:
coupling a gate of a transistor of one of the plurality of current sources to a VCO control signal after a corresponding one of the plurality of compensation control signals transitioning from a logic low level to a logic high level.

* * * * *